United States Patent
You et al.

(10) Patent No.: US 8,270,215 B2
(45) Date of Patent: Sep. 18, 2012

(54) NONVOLATILE MEMORY DEVICE AND METHOD OF PROGRAMMING THE SAME

(75) Inventors: Byoung Sung You, Hwaseong-si (KR); Jin Su Park, Daegu (KR); Seong Je Park, Suwon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 192 days.

(21) Appl. No.: 12/826,064

(22) Filed: Jun. 29, 2010

(65) Prior Publication Data

US 2010/0329030 A1    Dec. 30, 2010

(30) Foreign Application Priority Data

Jun. 29, 2009    (KR) .................. 10-2009-0058464

(51) Int. Cl.
*G11C 11/34* (2006.01)

(52) U.S. Cl. ......... 365/185.09; 365/185.12; 365/185.17; 365/185.21; 365/185.22

(58) Field of Classification Search ............. 365/185.09, 365/185.12, 185.17, 185.21, 185.22
See application file for complete search history.

(56) References Cited

U.S. PATENT DOCUMENTS

| | | | | |
|---|---|---|---|---|
| 6,118,703 | A  * | 9/2000 | Hamaguchi | 365/185.22 |
| 7,024,598 | B2 * | 4/2006 | Jeong et al. | 714/704 |
| 7,203,091 | B2 * | 4/2007 | Inoue et al. | 365/185.09 |
| 7,242,615 | B2 * | 7/2007 | Nagashima | 365/185.09 |
| 7,317,636 | B2 * | 1/2008 | Ide et al. | 365/185.09 |
| 7,434,111 | B2 * | 10/2008 | Sugiura et al. | 365/185.09 |
| 7,590,006 | B2 * | 9/2009 | Tokiwa | 365/185.09 |
| 8,040,735 | B2 * | 10/2011 | Honma | 365/185.22 |
| 8,045,393 | B2 * | 10/2011 | Kim et al. | 365/185.22 |

FOREIGN PATENT DOCUMENTS

KR    1020080063599    7/2008

OTHER PUBLICATIONS

Korean Notice of Allowance for 10-2009-0058464, citing the above reference(s).

* cited by examiner

*Primary Examiner* — Trong Phan

(74) *Attorney, Agent, or Firm* — Lowe Hauptman Ham & Berner, LLP

(57) ABSTRACT

In a nonvolatile memory device, a cache program operation for the next data is performed in a first latch, and a verification program operation for the current data is performed using a second latch. Thus, data collision can be avoided and execution time can be reduced.

20 Claims, 11 Drawing Sheets

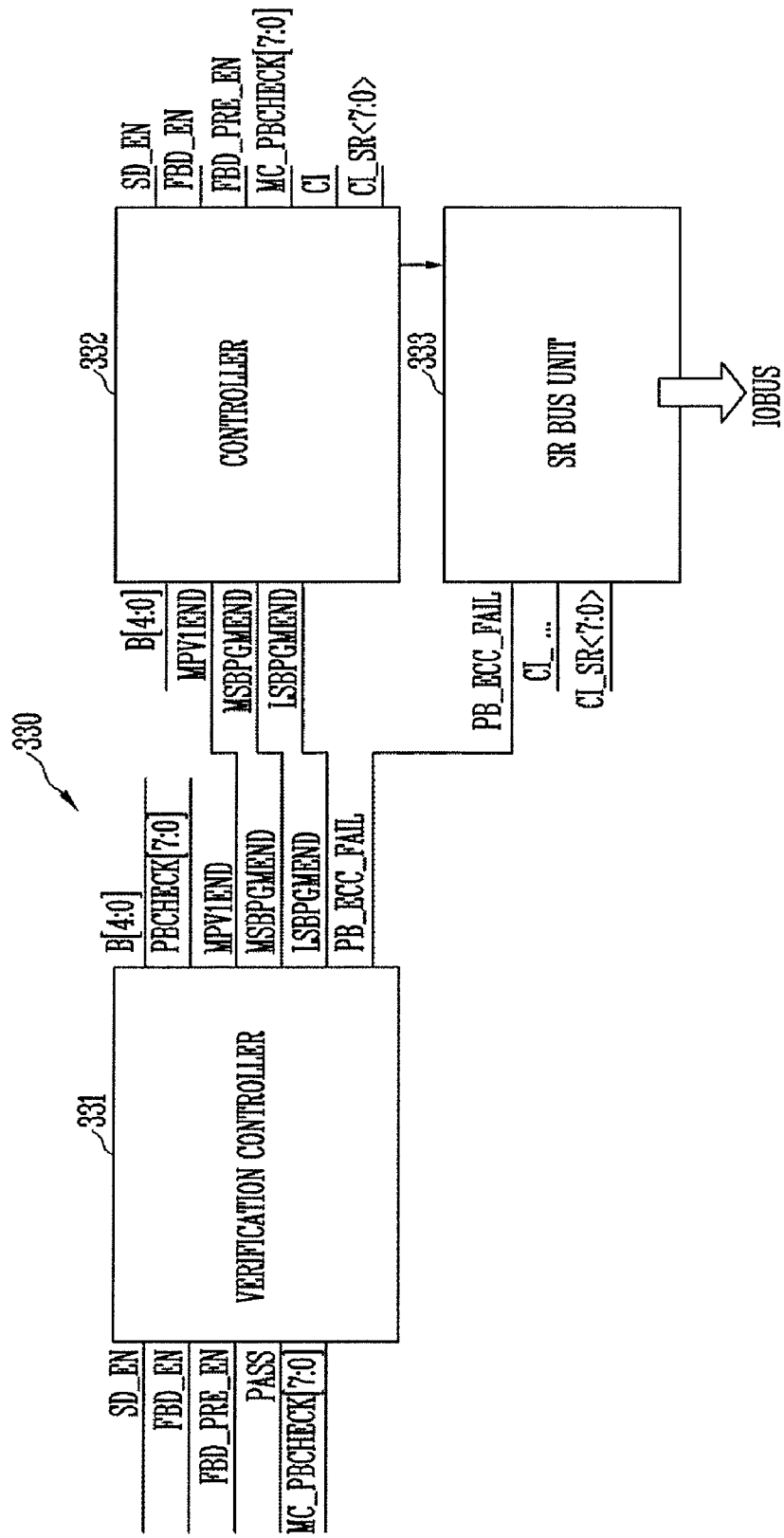

NONVOLATILE MEMORY DEVICE AND METHOD OF PROGRAMMING THE SAME

CROSS-REFERENCE TO RELATED APPLICATION

Priority to Korean patent application number 10-2009-0058464 filed on Jun. 29, 2009, the entire disclosure of which is incorporated by reference herein, is claimed.

BACKGROUND

The disclosure relates to a nonvolatile memory device and a method of programming the same.

A nonvolatile memory device has various advantages. For example, it can allow random access to the memory, enable data writing and erasure, permit read only access to the memory, retain data even without the supply of power, etc. Therefore, nonvolatile memory devices have recently been widely used as/in the storage media for portable electronic devices, such as digital cameras, personal digital assistants (PDAs), and MP3 players.

FIG. 1A is a diagram showing a nonvolatile memory device 100.

Referring to FIG. 1A, the nonvolatile memory device 100 includes a memory cell array 110, a page buffer unit 120, and a control unit 130.

The memory cell array 110 includes a plurality of memory blocks. Each of the memory blocks includes a plurality of memory cells. The memory cells are coupled to respective bit lines BL and word lines WL.

The page buffer unit 120 includes page buffers PB each coupled to one or more of the bit lines BL. The page buffer unit 120 outputs a verification signal through a verification line nWDo coupled in common to the page buffers PB.

The control unit 130 outputs a control signal to control the operations of the nonvolatile memory device 100 and determines a program pass or a program fail on the basis of the verification signal. The control unit 130 includes an error correcting code (ECC) circuit 131 for error correction.

The ECC circuit 131 performs error correction for a specific number or more of fail bits when a program verification operation is performed or when data is read.

The nonvolatile memory device 100 can perform an intelligent verification operation using the ECC circuit 131. In the intelligent verification operation, when the number of fail bits is within a correctable number during program verification, a corresponding program operation is no longer performed. According to the intelligent verification operation, the time that it takes to perform a program operation can be reduced.

The page buffer PB of the nonvolatile memory device 100 is described in more detail below.

FIG. 1B is a detailed diagram of the page buffer PB shown in FIG. 1A.

Referring to FIG. 1B, the memory cell array 110 includes a number of the memory blocks BK0 to BKn. Each of the memory blocks includes a plurality of cell strings CS. Each of the cell strings CS is coupled to an even bit line BLE or an odd bit line BLO.

The cell string CS includes first to thirty-second memory cells C0 to C31 coupled in series between a drain select transistor DST and a source select transistor SST.

To the gate of the drain select transistor DST is coupled a drain selection line DSL. To the gate of the source select transistor SST is coupled a source selection line SSL.

First to thirty-second word lines WL0 to WL31 are coupled to the respective gates of the first to thirty-second memory cells C0 to C31.

The nonvolatile memory device 100 performs a program on a page basis. In a single level cell (SLC) memory where each cell is capable of storing one bit, one page corresponds to one word line.

In a multi-level cell (MLC) memory where each cell is capable of storing 2 bits or more, one word line corresponds to a physical page that can include a plurality of logical pages depending on the number of bits that can be stored in each cell. For example, in a multi-level cell (MLC) memory where each cell is capable of storing 3 bits, one physical page includes three logical pages.

The even bit line BLE or the odd bit line BLO is coupled to the drain of the drain select transistor DST. A common source line SL is coupled to the source of the source select transistor SST.

Meanwhile, the page buffer unit 120 includes the page buffers PB each coupled to one or more of the bit lines BL. Each of the page buffers PB includes a bit line selection unit 121, a detection unit 122, a precharge unit 123, a cache latch L1, and a main latch L2.

The bit line selection unit 121 selects one of the even bit line BLE and the odd bit line BLO and couples the selected bit line BLE or BLO to a first detection node SO1. The detection unit 122 detects a voltage of the selected bit line BLE or BLO coupled to the first detection node SO1 and changes a voltage of a second detection node SO2 on the basis of the detected voltage.

The precharge unit 123 precharges the second detection node SO2. The cache latch L1 and the main latch L2 either (i) latch data according to the voltage of the second detection node SO2 or (ii) latch data to be programmed and then output the latched data to the second detection node SO2.

The cache latch L1 is coupled to a data input and output (I/O) line IO. The cache latch L1 inputs or outputs data to or from the data I/O line and stores data during a cache program operation. The main latch L2 is used to program data transferred by the cache latch L1.

In a program verification operation, a verification result stored in the main latch L2 is moved to the cache latch L1, and the program verification operation is performed through the verification line nWDo coupled to the cache latch L1. The page buffer PB can further includes a temporary latch (not shown) for storing data.

The bit line selection unit 121 includes first to fourth NMOS transistors N1 to N4. The detection unit 122 includes a fifth NMOS transistor N5. The precharge unit 123 includes a PMOS transistor P. The latch unit 124 includes one or more latch circuits.

The first and second NMOS transistors N1, N2 are coupled between the even bit line BLE and the odd bit line BLO. A variable voltage VIRPWR is supplied to a node between the first and second NMOS transistors N1, N2.

An even discharge control signal DISCHE is supplied to the gate of the first NMOS transistor N1. An odd discharge control signal DISCHO is supplied to the gate of the second NMOS transistor N2.

The third NMOS transistor N3 is coupled between the even bit line BLE and the first detection node SO1. The fourth NMOS transistor N4 is coupled between the odd bit line BLO and the first detection node SO1.

An even selection signal SELBLE is supplied to the gate of the third NMOS transistor N3. An odd selection signal SELBLO is supplied to the gate of the fourth NMOS transistor N4.

The fifth NMOS transistor N5 is coupled between the first and second detection nodes SO1, SO2. A detection signal SENSE is supplied to the gate of the fifth NMOS transistor N5.

The PMOS transistor P is coupled between a power source input terminal and the second detection node SO2. A precharge control signal PRECHSO_N is supplied to the gate of the PMOS transistor P.

In the nonvolatile memory device, when the intelligent verification operation is performed, a column scan method of performing fail verification for every four columns is used. Assuming that a bit line pair, including the even bit line BLE and the odd bit line BLO, is one column line, the memory cell array 110 includes a plurality of the column lines. That is, one page buffer PB is coupled to one column line.

In the column scan method, "column scan" means to check program verification results stored in the main latches L2 of page buffers PB coupled to all the column lines for every four column lines in the order of column addresses.

Meanwhile, the nonvolatile memory device 100 uses a cache program operation in order to reduce the program time. The cache program operation is performed in such a manner that, since the cache latch L1 is not used during the time for which a program is performed in the main latch L2, the cache latch L1 receives data to be programmed into the memory cells of a next page in order to reduce the program time.

FIG. 2 is a diagram illustrating a program operation of the nonvolatile memory device 100.

Referring to FIG. 2, to inform the nonvolatile memory device 100 of a program operation, a program command 80h is inputted to the nonvolatile memory device 100, and an address ADD, data DATA to be programmed, and an execution command 15h are also inputted to the nonvolatile memory device 100.

A program for an $N^{th}$ page is performed in response to the command. The program operation of the nonvolatile memory device has already been known, and a detailed description thereof is omitted.

When the memory cells of the nonvolatile memory device 100 are multi-level cells (MLC) capable of storing 2 bits of data in each cell, the threshold voltages of the memory cells are shifted through the program operation so that they are included in first to fourth threshold voltage distributions. Next, program verification for the memory cells is performed using first to third verification voltages PV1 to PV3.

In general, when a program verification result using the first verification voltage PV1 is a program pass, the cache latch L1 is changed to an unused state. Here, the cache program operation of previously receiving data to be programmed into the memory cells of a next page can be performed.

That is, as shown in FIG. 2, when the program verification result using the first verification voltage PV1 is a program pass, the cache latch L1 is in an empty state (i.e., an unused state). Accordingly, during the time for which the program for the $N^{th}$ page is performed until program verification results using the second and third verification voltages PV2, PV3 (not shown) indicate a program pass, a program command 80h, an address ADD, data DATA to be programmed, and an execution command 15h can be inputted to the nonvolatile memory device 100 in order to perform a program for an $(N+1)^{th}$ page.

The data to be programmed into the memory cells of the $(N+1)^{th}$ page is inputted to the cache latch L1. When the program for the $N^{th}$ page is completed, the data inputted to the cache latch L1 and to be programmed into the $(N+1)^{th}$ page is moved to the main latch L2, and the program for the $(N+1)^{th}$ page is then performed.

However, when the nonvolatile memory device 100 performs the intelligent verification operation, the following problem can arise. Although the program verification result using the first verification voltage PV1 is a program pass, the program verification operations using the second and third verification voltages PV2, PV3 continue. At this time, when the intelligent verification operation is used, after verification data stored in the main latch L2 is moved to the cache latch L1, a verification operation using the column scan method must be simultaneously performed.

If, during the time for which the column scan for the intelligent verification operation is performed, the data to be programmed into the memory cells of the $(N+1)^{th}$ page is inputted to the cache latch L1, the two pieces of data are inputted to the cache latch L1. This leads to an error resulting from a collision between the data. To prevent such error, during the time for which the data for the $(N+1)^{th}$ page is inputted, the column scan is stopped (<Stop Column Scan>) until the input of data for the $(N+1)^{th}$ page is completed.

After the input of data for the $(N+1)^{th}$ page is completed, the data stored in the cache latch L1 is moved to a temporary latch (not shown). The column scan is then performed or resumed. Accordingly, the program time is increased.

SUMMARY

In an aspect of the present disclosure, a nonvolatile memory device comprises a plurality of memory pages, a page buffer unit, a fail bit count unit, and a control unit. The page buffer unit comprises a plurality of page buffers. Each page buffer is coupled to one of the memory pages and comprises a first latch and a second latch. The first latch is coupled to a data input and output (I/O) line and configured to input or output data to or from the data I/O line. The second latches of the page buffers are commonly coupled to a verification line. The fail bit count unit is coupled to the verification line and configured to count a number of fail bits based on a current of the verification line. The control unit is coupled to the page buffer unit and the fail bit count unit and configured to input data for a next program to the first latch, determine whether to perform error correction based on the number of fail bits counted by the fail bit count unit, and control a program operation based on a result of the determination.

In a further aspect, a method of programming a nonvolatile memory device comprises performing a program operation for programming data, stored in first and second latches of a page buffer associated with a memory page of the nonvolatile memory device, in response to a program command; determining whether the first latch is available for use in response to a cache program command; storing data, received along with the cache program command, in the first latch, while, at the same time, performing a program verification operation for the program operation using the second latch.

BRIEF DESCRIPTION OF THE DRAWINGS

FIG. 3D is a detailed diagram of a control unit shown in FIG. 3A;

DETAILED DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
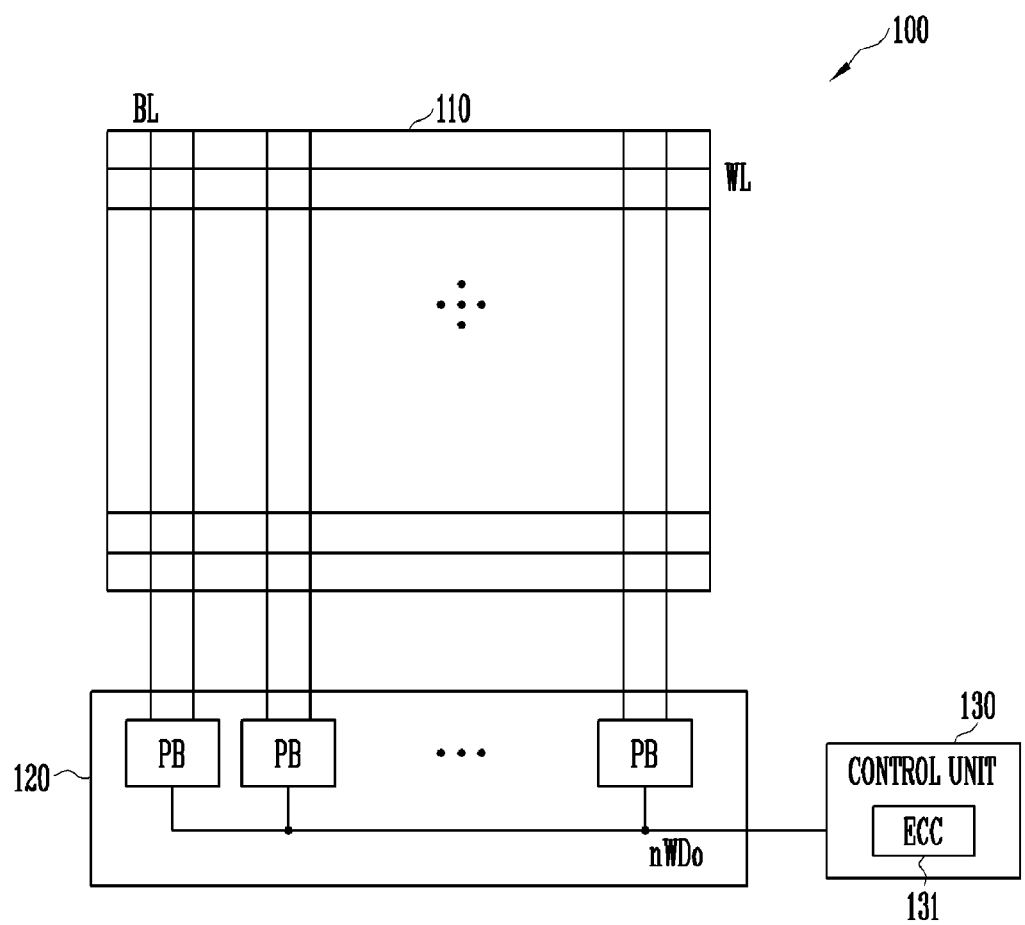
FIG. 1A is a diagram showing a nonvolatile memory device.
Figure 1B:
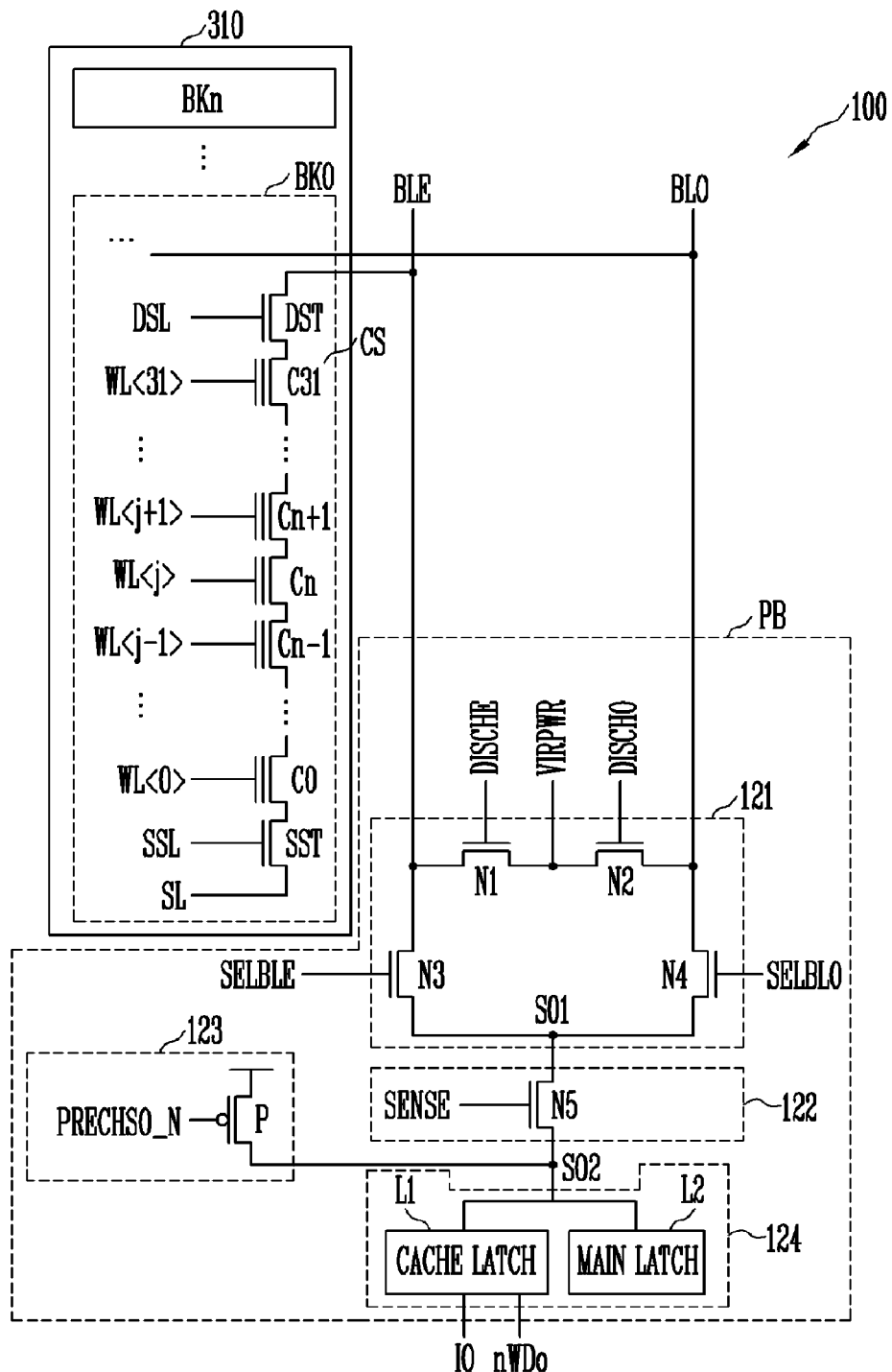
FIG. 1B is a detailed diagram of a page buffer shown in FIG. 1A.
Figure 2:
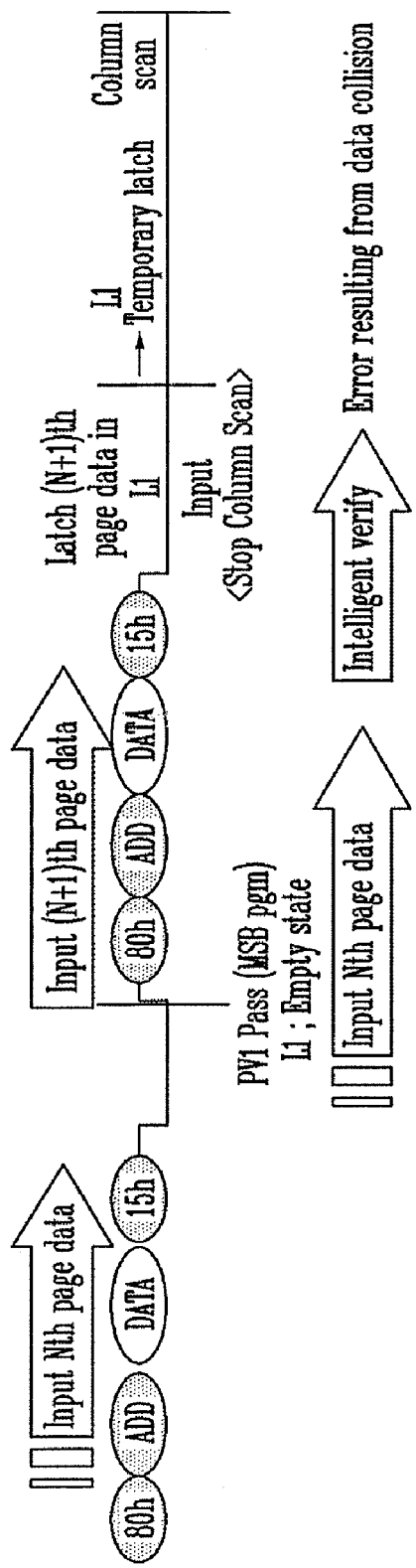
FIG. 2 is a diagram illustrating a program operation of the nonvolatile memory device of FIG. 1.
Figure 3A:
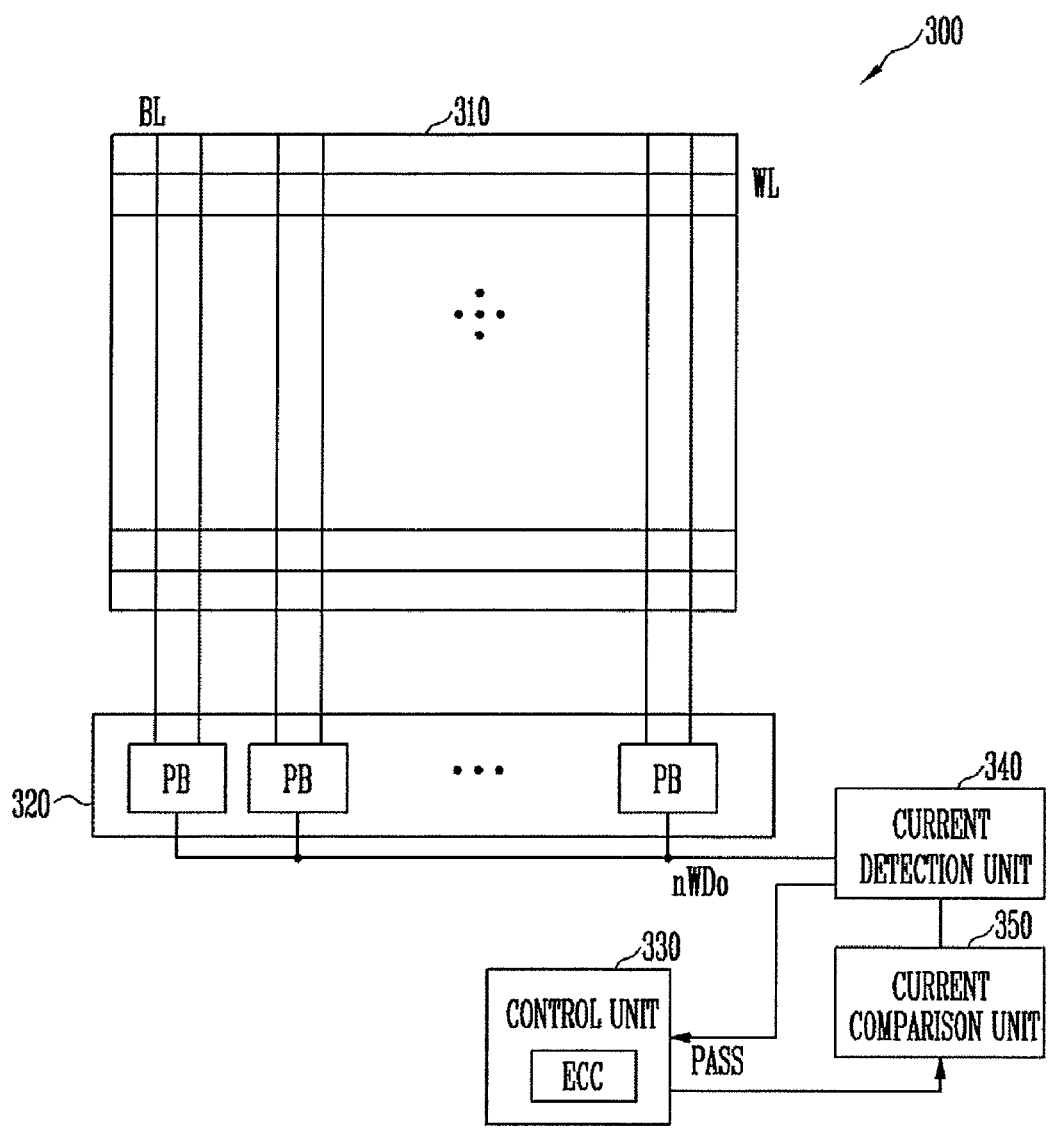
FIG. 3A is a diagram showing a nonvolatile memory device according to an embodiment of this disclosure.

FIG. 3A is a diagram showing a nonvolatile memory device 300 according to an embodiment of this disclosure.

Referring to FIG. 3A, the nonvolatile memory device 300 includes a memory cell array 310, a page buffer unit 320, a control unit 330, a current detection unit 340, and a current comparison unit 350.

The memory cell array 310 includes a plurality of memory blocks. Each of the memory blocks includes a plurality of memory cells. The memory cells are coupled to respective bit lines BL and word lines WL.

The page buffer unit 320 includes page buffers PB each coupled to one or more of the bit lines BL. The page buffer unit 320 outputs a verification signal through a verification line nWDo coupled in common to the page buffers PB.

The verification line nWDo is coupled to the current detection unit 340. The current detection unit 340 detects current values of the verification line nWDo and outputs a verification signal PASS according to the current values. The current comparison unit 350 changes a logic level of the verification signal PASS in response to the current values detected by the current detection unit 340.

The control unit 330 counts fail bits in response to a shift in the logic level of the verification signal PASS and controls a program operation on the basis of the counted number of fail bits. The control unit 330 includes an ECC circuit for error correction.

The control unit 330 can perform an intelligent verification operation for terminating the program operation if error correction is possible on the basis of the counted number of fail bits.

The page buffer PB is described in more detail below.

Figure 3B:
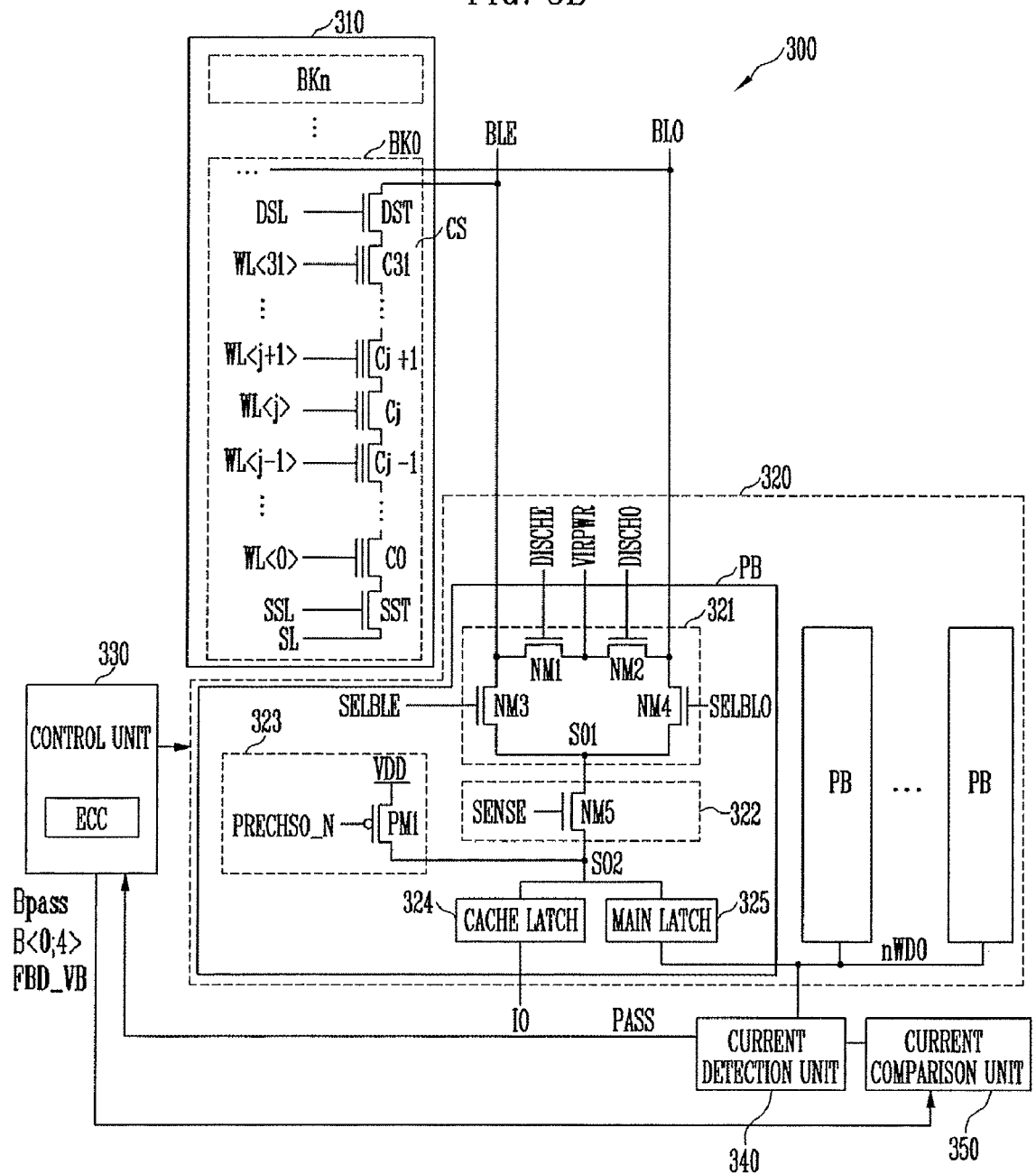
FIG. 3B is a detailed diagram of a page buffer shown in FIG. 3A.

FIG. 3B is a detailed diagram of the page buffer PB shown in FIG. 3A.

In FIG. 3B, a cell string CS coupled to an even bit line BLE or an odd bit line BLO (which are, in turn, coupled to the page buffer PB) is also shown in detail.

Referring to FIG. 3B, the memory cell array 310 includes a number of the memory blocks BK0 to BKn. Each of the memory blocks includes a plurality of the cell strings CS. Each of the cell strings CS is coupled to the even bit line BLE or the odd bit line BLO.

Each cell string CS includes any number of memory cells. A corresponding number of word lines are coupled to the respective gates of the memory cells in each cell string CS. In the specifically illustrated embodiment, the cell string CS includes first to thirty-second memory cells C0 to C31 coupled in series between a drain select transistor DST and a source select transistor SST.

To the gate of the drain select transistor DST is coupled a drain selection line DSL. To the gate of the source select transistor SST is coupled a source selection line SSL.

First to thirty-second word lines WL0 to WL31 are coupled to the respective gates of the first to thirty-second memory cells C0 to C31.

The nonvolatile memory device 300 performs a program on a page basis. In a single level cell (SLC) memory where each cell is capable of storing 1 bit, one page corresponds to one word line.

In a multi-level cell (MLC) memory where each cell is capable of storing 2 bits or more, one word line corresponds to a physical page that can include a plurality of logical pages depending on the number of bits that can be stored in each cell. For example, in a multi-level cell (MLC) memory where each cell is capable of storing 3 bits, one physical page includes three logical pages.

The even bit line BLE or the odd bit line BLO is coupled to the drain of the drain select transistor DST. A common source line SL is coupled to the source of the source select transistor SST.

Meanwhile, the page buffer unit 320 includes the page buffers PB each coupled to one or more of the bit lines BL. FIG. 3B shows only one page buffer PB in detail. Each of the page buffers PB includes a bit line selection unit 321, a detection unit 322, a precharge unit 323, a cache latch 324, and a main latch 325.

The bit line selection unit 321 selects one of the even bit line BLE and the odd bit line BLO and couples the selected bit line BLE or BLO to a first detection node SO1. The detection unit 322 detects a voltage of the selected bit line BLE or BLO coupled to the first detection node SO1, and changes a voltage of a second detection node SO2 on the basis of the detected voltage.

The precharge unit 323 precharges the second detection node SO2. The cache latch 324 and the main latch 325 either (i) latch data according to the voltage of the second detection node SO2 or (ii) latch data to be programmed and the output the latched data to the second detection node SO2.

The cache latch 324 is coupled to a data input and output (I/O) line IO and configured to input or output data to or from the data I/O line. The main latch 325 is used for an operation of programming data transferred by the cache latch 324. The main latch 325 outputs a verification signal according to a result of a program verification operation through the verification line nWDo.

The page buffer PB can further includes a temporary latch (not shown) for storing data.

In an exemplary configuration, the bit line selection unit 321 includes first to fourth NMOS transistors NM1 to NM4, the detection unit 322 includes a fifth NMOS transistor NM5, and the precharge unit 323 includes a first PMOS transistor PM1.

The first and second NMOS transistors NM1, NM2 are coupled between the even bit line BLE and the odd bit line BLO. A variable voltage VIRPWR is supplied to a node between the first and second NMOS transistors NM1, NM2.

An even discharge control signal DISCHE is supplied to the gate of the first NMOS transistor NM1. An odd discharge control signal DISCHO is supplied to the gate of the second NMOS transistor NM2.

The third NMOS transistor NM3 is coupled between the even bit line BLE and the first detection node S01. The fourth NMOS transistor NM4 is coupled between the odd bit line BLO and the first detection node SO1.

An even selection signal SELBLE is supplied to the gate of the third NMOS transistor NM3. An odd selection signal SELBLO is supplied to the gate of the fourth NMOS transistor NM4.

The fifth NMOS transistor NM5 is coupled between the first and second detection nodes SO1, SO2. A detection signal SENSE is supplied to the gate of the fifth NMOS transistor NM5.

The first PMOS transistor PM1 is coupled between a power source input terminal VDD and the second detection node SO2. A precharge control signal PRECHSO_N is supplied to the gate of the first PMOS transistor PM1.

The current detection unit 340 is coupled to the verification line nWDo to which the main latches 325 of the page buffers PB are coupled in common. The current detection unit 340 detects electric currents flowing from the main latches 325 of all the page buffers PB through the verification line nWDo, and outputs the verification signal PASS according to the detected currents of the verification line nWDo. The current comparison unit 350 compares reference currents with the currents detected by the current detection unit 340, in order to determine the number of fail bits.

When electric currents of all the page buffers PB of the page buffer unit 320 are detected in order to count the number of fail bits, the number of reference currents is increased. An increase in the number of reference currents results in an increase in the size of the current comparison unit 350.

In an embodiment of this disclosure, in order to prevent an excessive increase in the size of the current comparison unit 350, a method is provided. The method includes classifying all the page buffers PB of the page buffer unit 320 into at least one group, e.g., some groups, counting the number of fail bits for every group, and determining a total number of the fail bits in all groups.

In an exemplary embodiment of this disclosure, all the page buffers PB of the page buffer unit 320 are classified into eight page buffer groups, and page buffer group selection signals PBCHECK[7:0] (best seen in FIG. 3D) are generated by the control unit 330 for selecting the respective eight page buffer groups. The control unit 330 further outputs a pass control signal Bpass, bit determination signals B0 to B4 (also referred to herein as B<0:4> or B[4:0]) and a current comparison control signal FBD_VB.

Figure 3C:
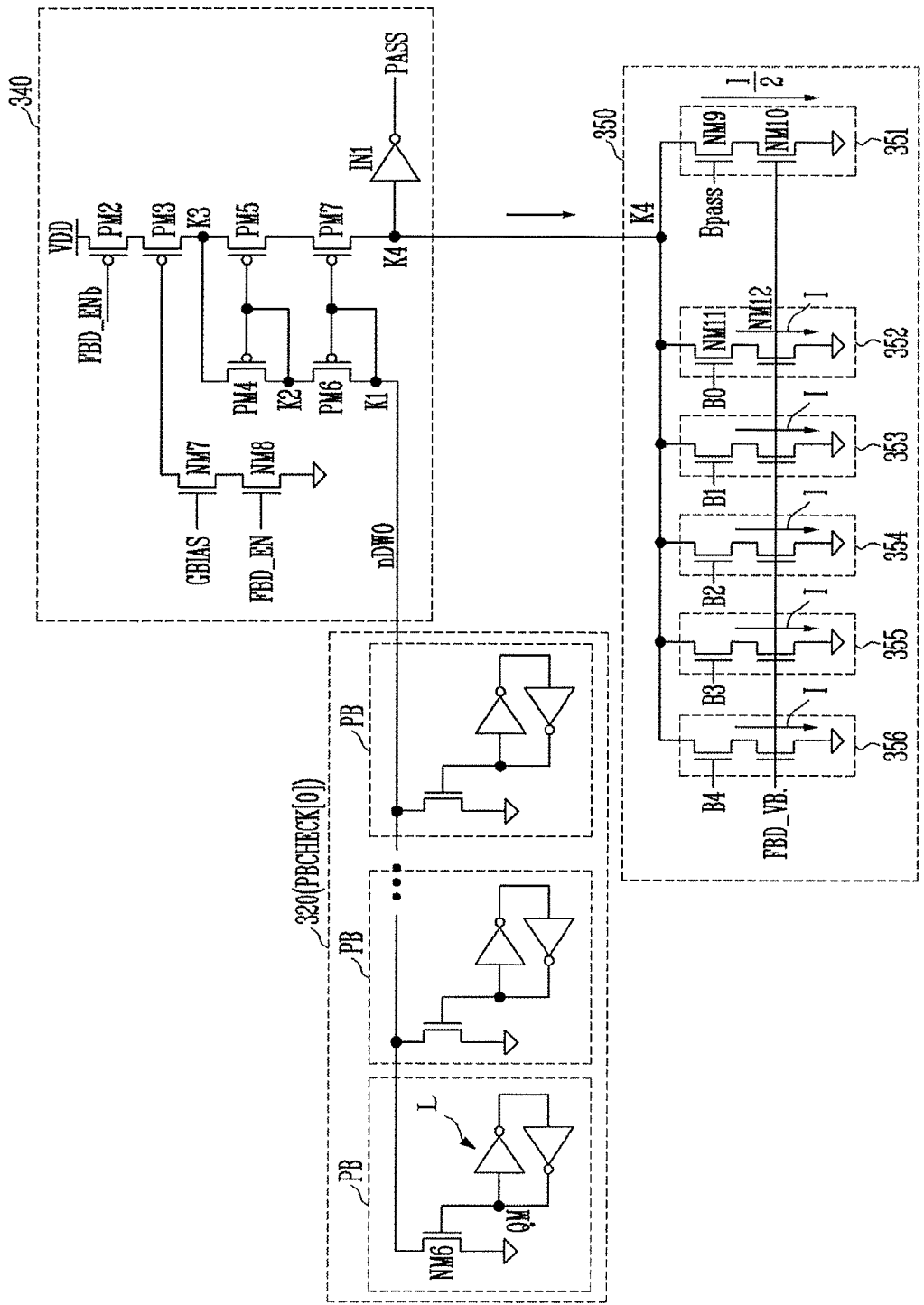
FIG. 3C is a circuit diagram of a page buffer unit, a current detection unit, and a current comparison unit shown in FIG. 3B.

FIG. 3C is a circuit diagram of the page buffer unit 320, the current detection unit 340, and the current comparison unit 350 shown in FIG. 3B.

Referring to FIG. 3C, the main latches 325 of all the page buffers PB included in the page buffer unit 320 are coupled in common to the verification line nWDo. FIG. 3C illustrates only a first page buffer group among the eight page buffer groups of the page buffer unit 320. The illustrated first page buffer group is responsive to the first page buffer group selection signal PBCHECK[0].

The verification line nWDo is coupled to the current detection unit 340. The current detection unit 340 detects electric currents of the verification line nWDo and outputs the detected currents. The current comparison unit 350 compares the currents outputted by the current detection unit 340 with the respective reference currents in order to determine the number of fail bits.

In an exemplary configuration, the main latch 325 of each of the page buffers PB of the page buffer unit 320 includes a sixth NMOS transistor NM6 and a latch circuit L, while the current detection unit 340 includes second to seventh PMOS transistors PM2 to PM7, seventh and eighth NMOS transistors NM7, NM8, and a first inverter IN1.

The current comparison unit 350 includes a reference current generator 351 and at least one current generator, e.g., first to fifth current generators 352 to 356. In an exemplary configuration, the reference current generator 351 includes ninth and tenth NMOS transistors NM9, NM10, while the first current generator 352 includes eleventh and twelfth NMOS transistors NM11, NM12. Each of the second to fifth current generators 353 to 356 has the same construction as the first current generator 352.

Current I flows through the first to fifth current generators 352 to 356 in response to respective first to fifth bit determination signals B0 to B4 which are generated by the control unit 330.

In the main latch 325 of each of the page buffers PB, the sixth NMOS transistor NM6 is coupled between a ground node and a node K1 coupled to the verification line nWDo. The gate of the sixth NMOS transistor NM6 is coupled to the node QM of the latch circuit L.

In the current detection unit 340, the second and third PMOS transistors PM2, PM3 are coupled in series between the power supply input terminal VDD and a node K3. A first fail bit detection enable signal FBD_ENb (which is an inverse of a second fail bit detection enable signal FBD_EN described herein below) is supplied to the gate of the second PMOS transistor PM2. The gate of the third PMOS transistor PM3 is coupled to the drain of the seventh NMOS transistor NM7.

The seventh and eighth NMOS transistors NM7, NM8 are coupled in series between the ground node and the gate of the third PMOS transistor PM3. A control signal GBIAS is supplied from control unit 330 to the gate of the seventh NMOS transistor NM7. A second fail bit detection enable signal FBD_EN is supplied from the control unit 330 to the gate of the eighth NMOS transistor NMB.

The fourth and sixth PMOS transistors PM4, PM6 are coupled in series between the node K3 and the node K1. The fifth and seventh PMOS transistors PM5, PM7 are coupled in series between the node K3 and a node K4.

The gates of the fourth and fifth PMOS transistors PM4, PM5 are coupled together and coupled to a node K2. The node K2 is a node between the fourth PMOS transistor PM4 and the sixth PMOS transistor PM6.

The gates of the sixth and seventh PMOS transistors PM6, PM7 are coupled together and coupled to the node K1.

The first inverter IN1 inverts a voltage level of the node K4 and outputs the inverted voltage level as the verification signal PASS.

The verification signal PASS is used to determine a program pass or a program fail. The verification signal PASS is supplied to the control unit 330.

In the current comparison unit 350, the ninth and tenth NMOS transistors NM9, NM10 are coupled in series between the node K4 and the ground node. A pass control signal Bpass is supplied from control unit 330 to the ninth NMOS transistor NM9. A current comparison control signal FBD_VB is supplied from control unit 330 to the gate of the tenth NMOS transistor NM10.

The ninth and tenth NMOS transistors NM9, NM10 form the reference current generator 351. The reference current generator 351 is configured to allow current ½I to flow therethrough.

Each of the first to fifth current generators 352 to 356 includes two NMOS transistors coupled together in series between the node K4 and the ground node. The first to fifth bit determination signals B0 to B4 are supplied to the gates of the first ones of the two NMOS transistors of the respective first to fifth current generators 352 to 356. The current comparison control signal FBD_VB is supplied in common to the gates of the second ones of the two NMOS transistors of the respective first second to fifth current generators 352 to 356.

For example, the eleventh and twelfth NMOS transistors NM11, NM12 are coupled in series between the node K4 and the ground node. The first bit determination signal B0 is supplied to the gate of the eleventh NMOS transistor NM11. The current comparison control signal FBD_VB is supplied to the gate of the twelfth NMOS transistor NM12.

To count the number of fail bits, first, the pass control signal Bpass and the current comparison control signal FBD_VB of a high level are supplied from the control unit 330. In response thereto, the ninth and tenth NMOS transistors NM9, NM10 of the reference current generator 351 are turned on.

The current of the verification line nWDo is changed in response to the state of data stored in the nodes QM of all the page buffer unit 320. The same current as that of the verification line nWDo flows through the node K4 by means of a current mirror defined by the sixth and seventh PMOS transistors PM6, PM7.

In the specifically illustrated configuration, when the data of the node QM of a page buffer PB has a logical state '1', it means the page buffers PB has a program fail. When the data of the node QM of a page buffer PB has a logical state '0', it means the page buffers PB has a program pass.

If the nodes QM of all the page buffers PB included in the page buffer unit 320 have data of the logical state '0', it means a program pass state. In the program pass state, a current path through the verification line nWDo is not formed. Accordingly, the node K4 is coupled to the ground node, and the verification signal PASS of a high level is outputted.

The verification signal PASS of the high level indicates a program pass.

When the node QM of a page buffer has data of the logical state '1', the sixth NMOS transistor NM6 is turned on, and a current path is formed through the verification line nWDo. It is assumed for the sake of simplicity that, if one page buffer PB has a program fail, the current of the verification line nWDo will be I. Likewise, if two page buffers PB each have a program fail, the current of the verification line nWDo will be 2I, etc.

The same current I as that of the verification line nWDo flows through the node K4 by means of the current mirror. Here, the ninth and tenth NMOS transistors NM9, NM10 are in a turn-on state.

However, the current that can flow to the ground node via the ninth and tenth NMOS transistors NM9, NM10 is only ½I. Accordingly, since only the current ½I flows to the ground node via reference current generator 351, the voltage of the node K4 remains sufficiently high. In this case, the first inverter IN1 outputs the verification signal PASS of a low level on the basis of the voltage of the node K4.

The control unit 330 sequentially supplies the first to fifth bit determination signals B0 to B4 to the respective first to fifth current generators 352 to 356 in order to determine the number of fail bits for every page buffer group.

First, the first current generator 352 is operated in response to the first bit determination signal B0 of a high level. Accordingly, the current ½I flows through the reference current generator 351, and the remaining current I flows through the first current generator 352. Thus, the current I flowing through the verification line nWDo all flows to the ground node, and the voltage of the node K4 shifts to a low level. Consequently, the verification signal PASS shifts to a high level.

The control unit 330 checks that the verification signal PASS shifts from a low level to a high level when the first bit determination signal B0 is supplied and determines that there is 1 fail bit.

If there are two fail bits, a current 2I flows through the verification line nWDo. Thus, when the reference current generator 351 is operated (which drains only ½I to the ground while leaving 1½I to flow through the node K4), the verification signal PASS is in a low level.

When the control unit 330 outputs the first bit determination signal B0, a current I flows to the ground node via the first current generator 352. However, since the current flowing through the verification line nWDo is 2I, a remaining current ½I still flows through the node K4. Accordingly, the verification signal PASS remains in a low level.

When the control unit 330 outputs the first bit determination signal B0 of a high level and the second bit determination signal B1 of a high level at the same time, both the first and second current generators 352, 353 are operated at the same time, and so current 2I can entirely flow to the ground node via the reference current generator 351, the first current generator 352 and the second current generator 353.

Therefore, the voltage of the node K4 drops, and the verification signal PASS shifts to a high level.

The control unit 330 can determine that 2 fail bits have occurred by checking that the verification signal PASS shifts to a high level when the first and second bit determination signals B1, B2 of a high level are supplied.

Likewise, the control unit 330 can count up to 5 fail bits by sequentially supplying the first to fifth bit determination signals B0 to B4. The first bit determination signal B0 is maintained when the second to fifth bit determination signals B1 to B4 are supplied. The second bit determination signal B1 is maintained when the third to fifth bit determination signals B2 to B4 are supplied etc.

Meanwhile, the page buffers PB of the page buffer unit 320 are classified into the first to eighth page buffer groups, the groups are sequentially coupled to the verification line nWDo, and fail bits are then counted for every one of the eight page buffer groups. The eight page buffer groups are selected using the respective first to eighth page buffer group selection signals PBCHECK[7:0] supplied from the control unit 330. If error correction for each page buffer group is possible up to five fail bits, the first to fifth current generators 352 to 356 are used.

If error correction for each page buffer group is possible up to a k number of fail bits, a corresponding number of k current generators are used.

The control unit 330 for determining whether error correction is possible by counting the fail bits is described in more detail below.

FIG. 3D is a detailed diagram of the control unit 330 shown in FIG. 3A.

Referring to FIG. 3D, the control unit 330 includes a verification controller 331, a controller 332, and an SR bus unit 333.

The verification controller 331 generates the first to fifth bit determination signals B[4:0] and the page buffer group selection signals PBCHECK[7:0] for verifying fail bits in response to signals SD_EN, FBD_EN, FBD_PRE_EN, and MC_PBCHECK[7:0] supplied by the controller 332.

The control signal SD_EN is used to select a single bit verification method for performing a program again, if any one bit is a fail bit during a program verification operation. The second fail bit detection enable signal FBD_EN is used to select a multi-bit verification method for determining whether fail bits have occurred up to the degree that error correction for the fail bits is possible during a program verification operation.

The control signal FBD_PRE_EN is used to enable the multi-bit verification method. The page buffer group selection signals MC_PBCHECK[7:0] outputted by the controller 332 are used to sequentially select the page groups during a fail bit verification operation.

The verification controller 331 generates first to third program completion signals MPV1END, MSBPGMEND, and LSBPGMEND in response to the verification signal PASS supplied from the current detection unit 340, and outputs an ECC determination signal PB_ECC_FAIL, indicating whether error correction is possible, on the basis of the number of fail bits counted based on the verification signal PASS.

The controller 332 generates the signals SD_EN, FBD_EN, FBD_PRE_EN, and MC_PBCHECK[7:0] for controlling the operation of the nonvolatile memory device 300. The controller 332 controls a program operation in response to the first to third program completion signals MPV1END, MSBPGMEND, and LSBPGMEND generated by the verification controller 331 and also has an ECC function.

The controller 332 outputs state code information CI, ..., CI_SR[7:0] which are changed in response to an operation of the nonvolatile memory device 300.

The SR bus unit 333 outputs the ECC determination signal PB_ECC_FAIL supplied by the verification controller 331, and the state code information CI..., CI_SR[7:0] supplied by the controller 332 to an external controller (not shown) of the nonvolatile memory device 300. In this case, an I/O bus IOBUS is used.

The verification controller 331 includes a verification unit 334 and a verification determination unit 335. The verification unit 334 determines whether error correction for fail bits is possible by counting the fail bits. The verification determination unit 335 generates the first to third program completion signals MPV1END, MSBPGMEND, and LSBPGMEND in response to the verification signal PASS.

Figure 3E:
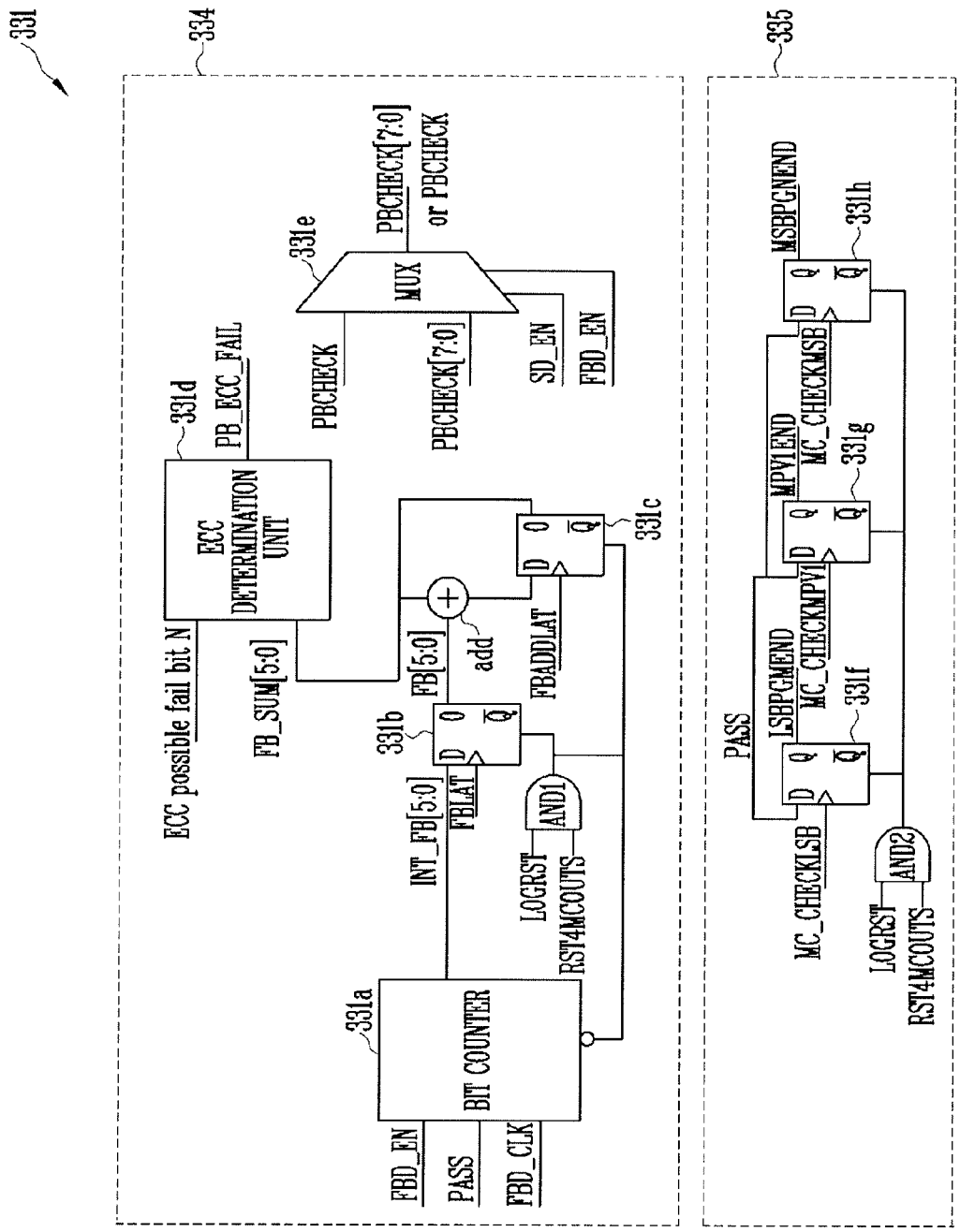
FIG. 3E is a detailed diagram of a verification controller shown in FIG. 3D.

FIG. 3E is a detailed diagram of the verification controller 331 shown in FIG. 3D.

Referring to FIG. 3E, the verification unit 334 includes a bit counter 331a, first and second flipflops 331b, 331c, an ECC determination unit 331d, and a MUX 331e. The verification determination unit 335 includes third to fifth flipflops 331f to 331h. In FIG. 3E, each flipflop 331f, 331g or 331h has a terminal D as an input terminal, a terminal Q as an output terminal, and a terminal $\overline{Q}$ as another output terminal that outputs a signal which is inverted from a signal of the terminal Q.

The bit counter 331a receives the second fail bit detection enable signal FBD_EN, the verification signal PASS, and a clock signal FBD_CLK and generates fail bit information INT_FB[5:0] when the verification signal PASS is shifted. Here, since fail bits for the eight page buffer groups are sequentially counted, the bit counter 331a sequentially generates the fail bit information INT_FB[5:0] when each of the verification signals PASS outputted to the eight page buffer groups is shifted. In other words, the number of times that the fail bit information INT_FB[5:0] are outputted is the same as the number of page buffer groups, i.e., 8.

The fail bit information INT_FB[5:0] outputted by the bit counter 331a are inputted to the first flipflop 331b. The first flipflop 331b latches the fail bit information INT_FB[5:0] in response to a latch control signal FBLAT.

The latch control signal FBLAT is internally generated within the verification controller 331. The fail bit information INT_FB[5:0] latched by the first flipflop 331b are added in an addition circuit add and then temporarily stored in the second flipflop 331c.

In other words, the addition circuit add sequentially receives the fail bit information INT_FB[5:0] eight times and sequentially adds the number of fail bits included in the fail bit information INT_FB[5:0]. An added value is temporarily stored in the second flipflop 331c in response to an addition latch control signal FBADDLAT. The added values for all the fail bit information INT_FB[5:0] are outputted as total fail bit information FB_SUM[5:0].

The ECC determination unit 331d compares the number of fail bits N that can be error-corrected with the total fail bit information FB_SUM[5:0] and outputs an ECC determination signal PB_ECC_FAIL based on a result of the comparison.

Meanwhile, when the control signal SD_EN is received, the MUX 331e determines that a program verification operation is based on a single bit verification method, and outputs a check signal PBCHECK from among the inputted check signal PBCHECK and the page buffer selection signals PBCHECK[7:0]. When the second fail bit detection enable signal FBD_EN is received, the MUX 331e sequentially outputs the page buffer group selection signals PBCHECK[7:0] for checking fail bits for each of the eight page buffer groups.

That is, the eight page buffer groups are sequentially selected in response to the first to eighth page buffer group selection signals PBCHECK[7:0]. The bit counter 331a counts the number of fail bits for each of the page buffer groups and produces the total fail bit information FB_SUM[5:0] by adding all the number of fail bits counted. The ECC determination unit 331d outputs the ECC determination signal PB_ECC_FAIL depending on whether error correction for the fail bits is possible (within the correctable number N) or not.

The ECC determination signal PB_ECC_FAIL is outputted to the SR bus unit 333 so that the external controller (not shown) of the control unit 330 can determine a program state.

The first AND gate AND1 of the verification unit 334 generates an initial reset signal in response to control signals LOGRST, RST4MCOUTS, thereby resetting the bit counter 331a and the first and second flipflops 331b, 331c. When the nonvolatile memory device 300 is first operated or during the time for which a reset operation is performed, the control signals LOGRST, RST4MCOUTS are supplied to the first AND gate AND1. The control signals LOGRST, RST4MCOUTS can be generated by the controller 332 or internally generated within the verification controller 331.

Meanwhile, the verification determination unit 335 generates the first to third program completion signals MPV1END, MSBPGMEND, and LSBPGMEND so that the controller 332 can determine whether a program will be terminated or continues to be performed. To this end, the verification determination unit 335 includes third to fifth flipflops 331f to 331h.

The second AND gate AND2 of the verification determination unit 335, like the first AND gate AND1, generates an initial reset signal in response to the control signals LOGRST, RST4MCOUTS, thereby resetting the third to fifth flipflops 331f, to 331h.

The third to fifth flipflops 331f to 331h are D flip-flops. The verification signal PASS is supplied to a terminal D of each of the third to fifth flipflops 331f to 331h.

First to third verification check signals MC_CHECKLSB, MC_CHECKMPV1, and MC_CHECKMSB are supplied to the respective clock terminals of the third to fifth flipflops 331f to 331h.

When the verification signal PASS is received in the state in which the first verification check signal MC_CHECKLSB of a high level has been received, the third flipflop 331f outputs the first program completion signal LSBPGMEND.

When the verification signal PASS is received in the state in which the second verification check signal MC_CHECKMPV1 of a high level has been received, the fourth flipflop 331g outputs the second program completion signal MPV1END.

When the verification signal PASS is received in the state in which the third verification check signal MC_CHECKMSB of a high level has been received, the fifth flipflop 331h outputs the third program completion signal MSBPGMEND.

The controller 332 controls operations, such as program execution or program termination in response to the first to third program completion signals MPV1END, MSBPGMEND, and LSBPGMEND.

The count of fail bits using the verification line nWDo according to the embodiment of this disclosure shown in FIGS. 3B to 3E, the cache program operation of receiving data for a cache program using the cache latch 324 in accordance with the ECC method, and the intelligent verification method of performing a program verification operation depending on whether fail bits can be corrected by counting the fail bits using the verification line nWDo of the main latch 325 can be performed at the same time.

Figure 4:
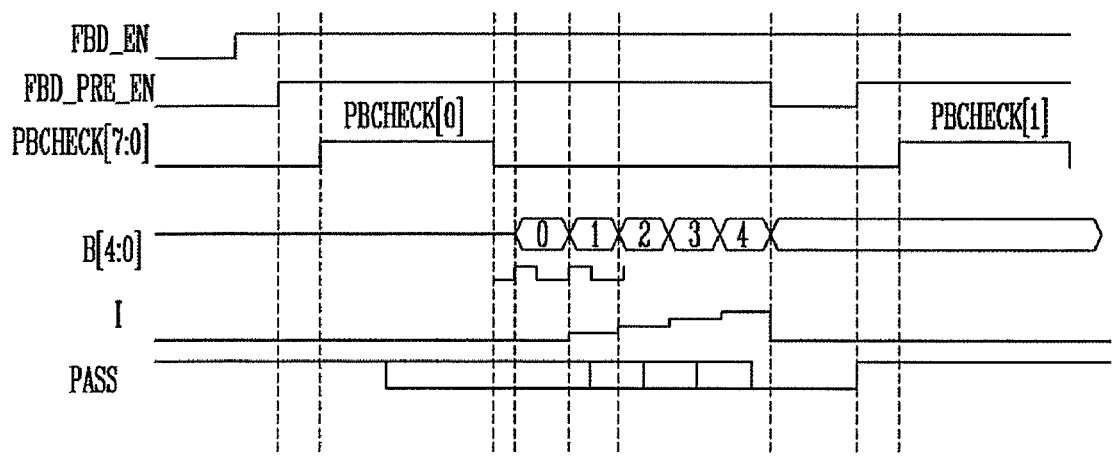
FIG. 4 is a timing diagram illustrating a program operation according to an embodiment of this disclosure.

FIG. 4 is a timing diagram illustrating a program operation according to an embodiment of this disclosure.

Referring to FIG. 4, first, a program command, address information, and data to be programmed are supplied to the nonvolatile memory device 300.

A bit line and a word line for a program operation are selected on the basis of the address information, and the data to be programmed is stored in the cache latch 324 and the main latch 325.

The program operation of the nonvolatile memory device 300 is performed in accordance with a known technique.

After the program operation is completed, a program verification operation is performed. First to third verification operations using first to third verification operation voltages PV1 to PV3 (not shown in FIGS. 3A-5C) are sequentially performed.

After the first verification operation is completed, the cache latch 324 can be used. Thus, next data to be programmed can be inputted to the cache latch 324 in accordance with the cache program operation.

In this case, since the program operation is still being performed, the main latch 325 is performing the program verification operation.

In an embodiment of this disclosure, next data to be programmed is inputted to the cache latch 324, and the main latch 325 performs a program verification operation. To this end, as shown in FIG. 3B, the number of fail bits is counted by detecting a current flowing through the verification line nWDo.

To this end, the second fail bit detection enable signal FBD_EN of a high level for selecting the multi-bit verification method is supplied, and the control signal FBD_PRE_EN of a high level for enabling a multi-bit verification operation is supplied. The second fail bit detection enable signal FBD_EN and the first fail bit detection enable signal FBD_ENb have an inverse relationship. For enabling the multi-bit verification operation, the control signal GBIAS of a high level is also supplied.

The second PMOS transistor PM2 is turned on in response to the first fail bit detection enable signal FBD_ENb of a low level. The eighth NMOS transistor NM8 is turned on in response to the second fail bit detection enable signal FBD_EN of a high level. The seventh NMOS transistor NM7 is turned on in response to the control signal GBIAS of a high level.

When the seventh and eighth NMOS transistors NM7, NM8 are turned on, the gate of the third PMOS transistor PM3 is coupled to the ground node, and so the third PMOS transistor PM3 is also turned on.

Accordingly, the power supply voltage VDD is supplied to the node K3.

The first page buffer group is selected in response to the first page buffer group selection signal PBCHECK[0]. Verification operation data stored in the main latches 325 of the page buffers PB included in the first page buffer group are checked through the verification line nWDo.

That is, the first page buffer group selection signal PBCHECK[0] of a high level is supplied so that a current path is formed in the verification line nWDo in response to the state of data stored in the main latches 325 of the page buffers PB included in the first page buffer group. The same amount of current as the amount of current flowing through the verification line nWDo flows through the node K4.

As described above with reference to FIG. 3B, if all the page buffers included in the first page buffer group are a program pass, a current path is not formed in the verification line nWDo, and so the node K4 is coupled to the ground node through the ninth and tenth NMOS transistors NM9, NM10. Accordingly, the verification signal PASS of a high level is supplied.

While the second to eighth page buffer group selection signals (only the second page buffer group selection signal PBCHECK[1] is illustrated in FIG. 4 for simplicity) are sequentially supplied as described above, the number of fail bits in each page buffer group is counted through the verification line nWDo.

That is, as shown in FIG. 4, in the state in which the first page buffer group selection PBCHECK[0] is in a high level, a current path is formed in the verification line nWDo on the basis of a result of program verification operation for the first page buffer group, and the first to fifth bit determination signals B0 to B4 (corresponding to "0", "1", "2", "3" and "4" in FIG. 4, respectively) are then sequentially supplied in order to count the number of fail bits. Here, the number of fail bits is counted based on the current I of the node K4. The current I shown in FIG. 4 shows the amount of current which is discharged through the current comparison unit 350 in response to the first to fifth bit determination signals B0 to B4.

The verification controller 331 outputs, to the controller 332, the ECC determination signal PB_ECC_FAIL depending on whether error correction for the counted fail bits is possible based on the total fail bit information FB_SUM[5:0] obtained in response to the first to eighth page buffer group selection signals PBCHECK[7:0].

The controller 332 can continue to perform the program operation or can terminate the program operation in response to the ECC determination signal PB_ECC_FAIL. That is, if error correction for the counted fail bits is determined to be possible in response to the ECC determination signal PB_ECC_FAIL, the controller 332 terminates the program operation. However, if error correction for the counted fail bits is determined not to be possible in response to the ECC determination signal PB_ECC_FAIL, the controller 332 raises a program voltage in accordance with an increment step pulse program (ISPP) method and performs the program operation.

If error correction for the counted fail bits is determined to be possible and so the program operation is terminated, a program operation using data stored in the cache latch 324 for a cache program is performed.

As described above, data for a cache program is inputted to the cache latch 324, and the main latch 325 performs program and program verification operations. During the time for which the program verification operation is performed, the intelligent verification method can be used.

For program verification operations of the main latches 325, the number of fail bits is counted by detecting currents through the verification line nWDo. Accordingly, the time that it takes to perform a program operation can be reduced without affecting data stored in the cache latches 324, leading to improved program performance.

Figure 5A:
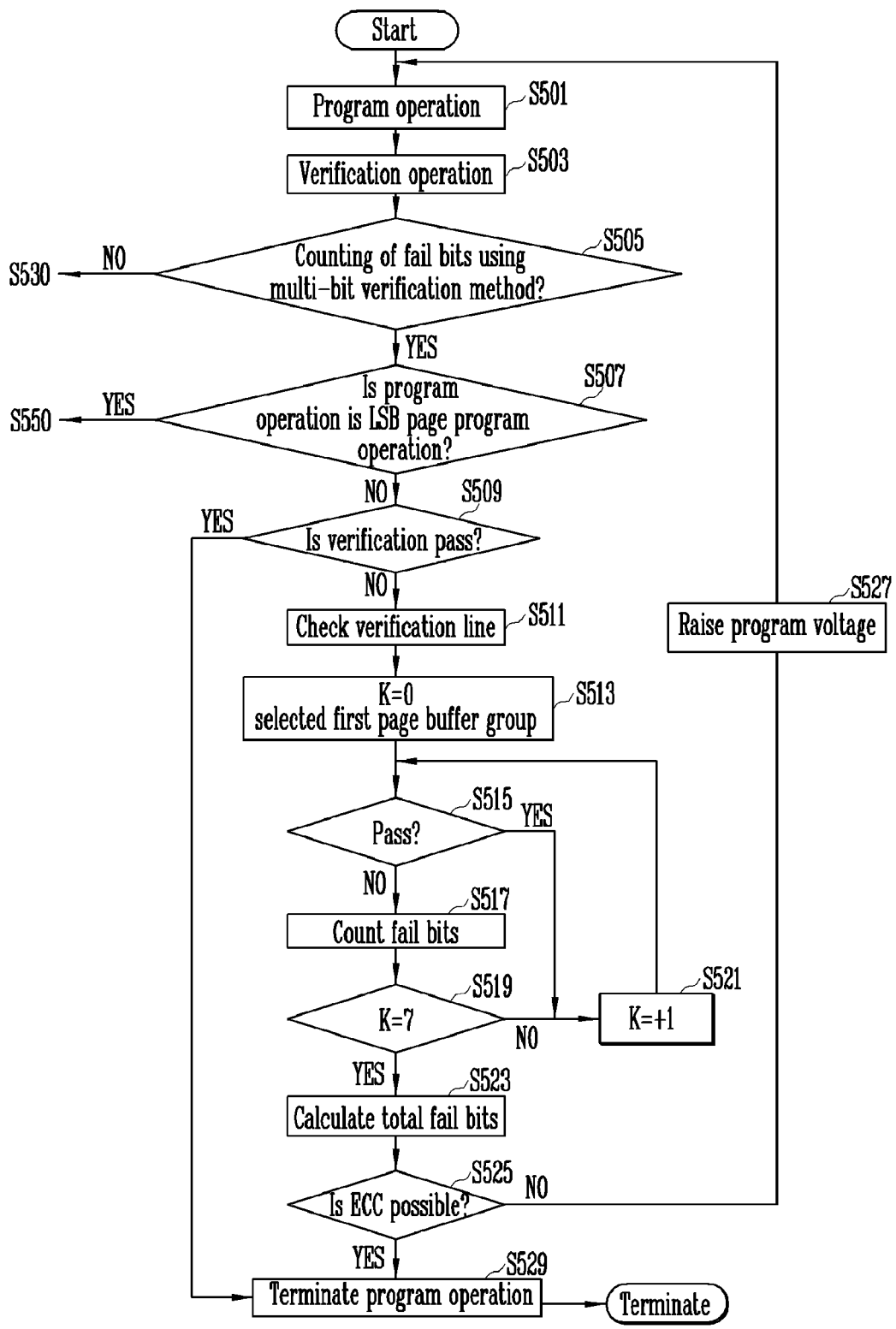
FIGS. 5A to 5C are flowcharts illustrating a program verification method according to an embodiment of this disclosure.
Figure 5B:
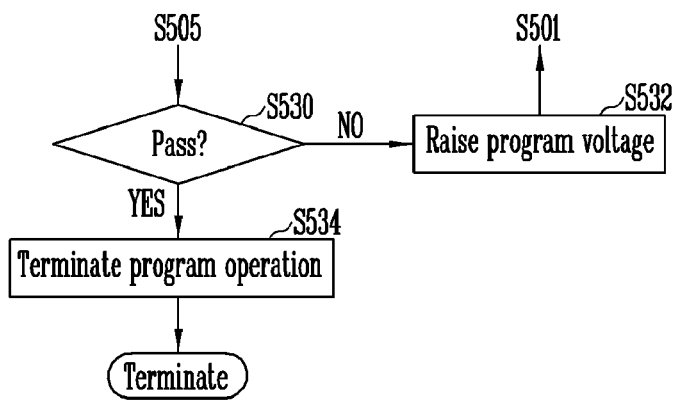
Figure 5C:
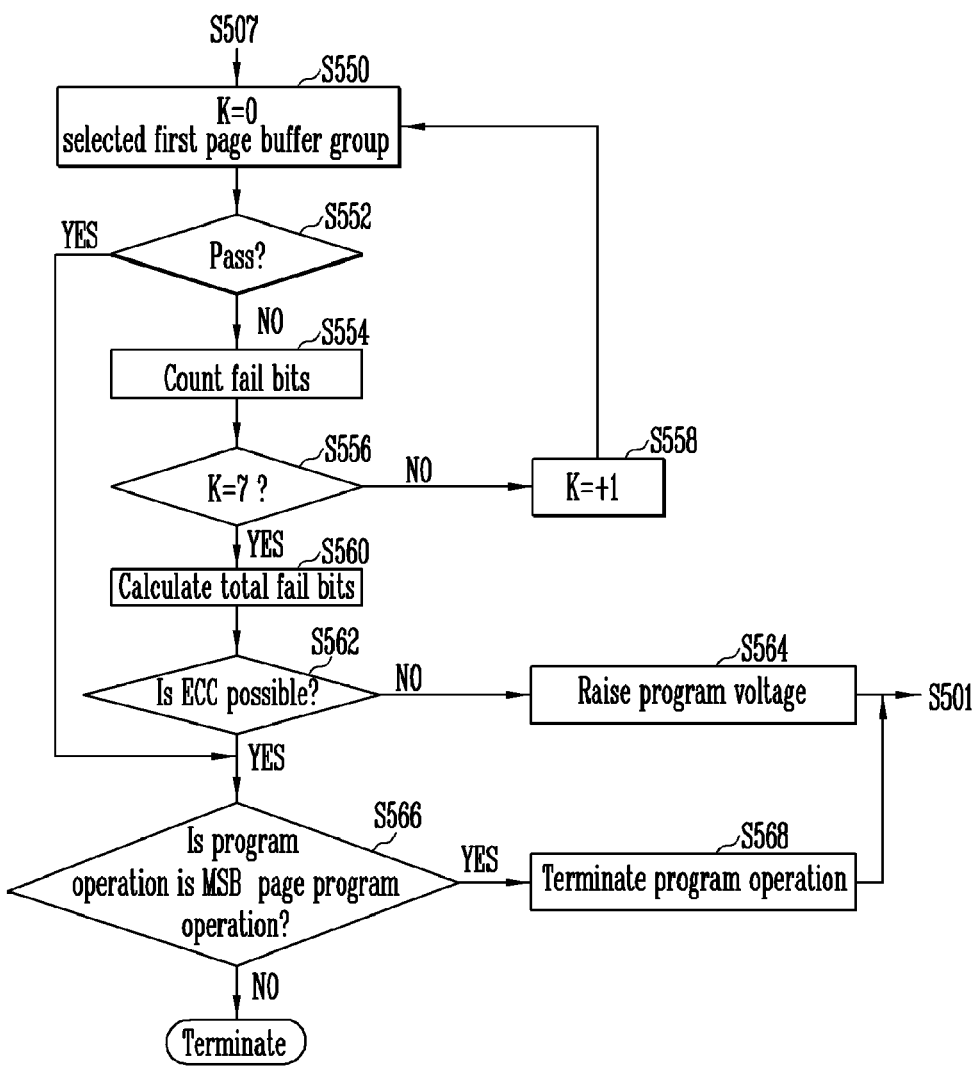

FIGS. 5A to 5C are flowcharts illustrating a program verification method according to an embodiment of this disclosure.

Referring to FIG. 5A, first, a program operation is performed on a selected memory cell in response to a program command at step S501. A result of a program verification operation is stored in the main latch 325 at step S503. It is then determined whether to count fail bits in accordance with the multi-bit verification method at step S505. The controller 332 determines whether to count the fail bits depending on whether the control signal SD_EN is outputted or the second fail bit detection enable signal FBD_EN is outputted.

If, as a result of the determination, fail bits are determined to be counted in accordance with the multi-bit verification method, it is determined whether the program operation is a least significant bit (LSB) page program operation at step S507. If, as a result of the determination, the program operation is determined not to be the least significant bit (LSB) page program operation, but to be a most significant bit (MSB) page program operation, it is determined whether a result of the verification operation at step S503 is a pass at step S509.

If, as a result of the determination, a result of the verification operation at step S503 is determined to be a pass, the program operation is completed at step S529 and the process is terminated.

However, if, as a result of the determination at step S509, a result of the verification operation at step S503 is determined not to be a pass, the verification line nWDo is checked for each of the first to eighth page buffer groups at step S511.

To this end, first, the first page buffer group is selected in response to the first page buffer group selection signal PBCHECK[0] at step S513. It is then determined whether all the page buffers included in the first page buffer group are a pass at step S515. If, as a result of the determination at step S515, any of the page buffers included in the first page buffer group is determined not to be a pass, the number of fail bits is counted at step S517. It is then determined whether the last page buffer group (i.e., K=7) has been reached at step S519. If, as a result of the determination at step S519, the last page buffer group (i.e., K=7) has not been reached, the subsequent (e.g., second) page buffer group is selected in response to the subsequent (e.g., second) page buffer group selection signal PBCHECK[1] (i.e., K=+1) at step S521. The operation of counting the number fail bits is repeatedly performed in response to the corresponding page buffer group selection signals PBCHECK. The method of counting fail bits has been described above with reference to FIG. 3C, and a description thereof is omitted.

If, as a result of the determination at step S519, the last page buffer group (i.e., K=7) has been reached, the verification controller 331 adds results of counting the fail bits for every page buffer group and generates the total fail bit information FB_SUM[5:0] at step S523. Such an operation has been described above with reference to FIG. 3D, and a description thereof is omitted.

Next, it is determined whether error correction for the fail bits is possible on the basis of the total fail bit information FB_SUM[5:0] at step S525. If, as a result of the determination, error correction for the fail bits is determined to be possible, the program operation is completed at step S529, and the process is terminated. However, if, as a result of the determination at step S525, error correction for the fail bits is determined not to be possible, a program voltage is raised at step S527, and the process returns to step S501.

Meanwhile, FIG. 5B is a flowchart illustrating a program verification method when the single bit verification method, rather than the multi-bit verification method, is used.

Referring to FIG. 5B, if, as a result of the determination at step S505 in FIG. 5A, fail bits are determined to be counted in accordance with the single bit verification method, the page buffers of all the page buffer groups are selected in response to the check signal PBCHECK, and it is determined whether all the page buffers are a program pass at step S530. If, as a result of the determination, any one of the page buffers is determined not to be a program pass, a program voltage is raised at step S532, and the process returns to step S501.

However, if, as a result of the determination at step S530, all the page buffers are determined to be a program pass, the program operation is completed at step S534, and the process is terminated.

Referring to FIG. 5C, if, as a result of the determination at step S507 in FIG. 5A, the program operation is determined to be the least significant bit (LSB) page program operation, a total number of fail bits are counted by performing the same steps S550 to S560 as steps S513 to S523 shown in FIG. 5A in response to the first to eighth page buffer group selection signals PBCHECK[7:0]. Here, the total number of fail bits refers to the number of fail bits according to a result of the least significant bit (LSB) page program operation.

Next, it is determined whether error correction for the fail bits is possible at step S562. If, as a result of the determination, error correction for the fail bits is determined to be possible, it is determined whether a most significant bit (MSB) page program operation will be performed at step S566. If, as a result of the determination, the most significant bit (MSB) page program operation is determined to be performed, MSB data are receive at step S568, and the process returns to step S501. During the time for which the most significant bit (MSB) page program operation is performed, the number of fail bits can be checked as described above with reference to FIG. 5A. Further, if, as a result of the determination at step S562, error correction for the fail bits is determined not to be possible, a program voltage is raised at step S564, and the process returns to step S501.

As described above, in accordance with the nonvolatile memory device and the method of programming the same according to this disclosure, during the time for which the cache program is performed using the latches of the page buffer, the intelligent verification operation is performed. Accordingly, the time taken for a program operation to be executed can be reduced, and the intelligent verification operation and the cache program operation can be simultaneously performed without data collision.

What is claimed is:
1. A nonvolatile memory device, comprising:
a plurality of bit lines;
a page buffer unit comprising a plurality of page buffers, each said page buffer being coupled to one of the bit lines and comprising a first latch coupled to a data input and output (I/O) line and configured to input or output data to or from the data I/O line; and a second latch coupled to a verification line;

a fail bit count unit coupled to the verification line to which the second latches are coupled in common and configured to count a number of fail bits based on a current of the verification line; and a control unit coupled to the page buffer unit and the fail bit count unit and configured to input data for a next program to the first latch, determine whether to perform error correction based on the number of fail bits counted by the fail bit count unit, and control a program operation based on a result of the determination.

2. The nonvolatile memory device of claim 1, wherein the fail bit count unit comprises:

a current detection unit coupled to the verification line and configured to detect the current of the verification line; and a current comparison unit coupled to the current detection unit and configured to compare the detected current with at least one reference current and to generate a verification signal indicating the number of fail bits according to a result of the comparison.

3. The nonvolatile memory device of claim 2, wherein the control unit is configured to determine a presence of one or more fail bits based on a shift in the verification signal from a first logic level to a second logic level.

4. The nonvolatile memory device of claim 3, wherein the control unit is configured to determine the number of fail bits based on a subsequent shift of the verification signal from the second logic level to the first logic level.

5. The nonvolatile memory device of claim 2, wherein the current comparison unit is configured to cause the verification signal to shift from a first logic level to a second logic level in response to a detection of the current on the verification line.

6. The nonvolatile memory device of claim 5, wherein the control unit is configured to, in response to the shift of the verification signal from the first logic level to the second logic level, cause the current comparison unit to sequentially compare the at least one reference current with the detected current until the verification signal shifts from the second logic level to the first logic level.

7. The nonvolatile memory device of claim 6, wherein the control unit is configured to determine the number of fail bits based on the reference current being compared to the detected current at the time the verification signal shifts from the second logic level to the first logic level.

8. The nonvolatile memory device of claim 2, wherein the current comparison unit comprises a reference current generator configured to partially discharge a current supplied from the current detection unit when the current detection unit detects the current on the verification line, said partial discharge being sufficient to cause the verification signal to shift from the first logic level to the second logic level.

9. The nonvolatile memory device of claim 8, wherein the current comparison unit further comprises at least one current generator coupled in parallel to the reference current generator, and said control unit is configured to sequentially turn on said at least one current generator to discharge a remaining portion of the current supplied from the current detection unit to cause the verification signal to shift from the second logic level to the first logic level.

10. The nonvolatile memory device of claim 1, wherein the page buffer unit comprises a plurality of page buffer groups each including one or more of the page buffers, the control unit is configured to enable connection of the second latches of the page buffers on one page buffer group at a time to the verification line, thereby counting the number of fail bits in one page buffer group at a time, calculate a total number of fail bits in all page buffer groups by adding the number of fail bits in each page buffer group, and determine whether to perform error correction or not based on the total number of fail bits.

11. The nonvolatile memory device of claim 1, wherein the control unit is configured to store the data for the next program in the first latch in response to a cache program command.

12. The nonvolatile memory device of claim 11, wherein the control unit is configured to determine whether the first latch has been designated for a program operation or a program verification operation and to input the data for the next program to the first latch.

13. The nonvolatile memory device of claim 11, wherein the control unit is configured to input the data for the next program to the first latch and, at the same time, perform a verification operation for data of a current program using the second latch.

14. A method of programming a nonvolatile memory device, the method comprising:

performing a program operation for programming data, stored in first and second latches of a page buffer associated with a bit line of the nonvolatile memory device, in response to a program command;

determining whether the first latch is available for use in response to a cache program command;

storing data, received along with the cache program command, in the first latch, while, at the same time, performing a program verification operation for the program operation using the second latch.

15. The method of claim 14, wherein said program verification operation comprises counting a number of fail bits through a verification line coupled to the second latch; and if the counted number of fail bits is within a correctable number of fail bits, terminating the program operation.

16. The method of claim 15, wherein said counting comprises:

detecting a current on the verification line;

comparing the detected current sequentially with a series of reference currents depending on the number of fail bits, and generating a verification signal according to a result of the comparison; and determining the number of fail bits when a logic level of the verification signal shifts during said comparing.

17. The method of claim 15, further comprising, if the counted number of fail bits is greater than the correctable number of fail bits, raising a program voltage, performing a program operation according to a state of the data stored in the second latch and with the raised program voltage, and performing a program verification operation for the program operation performed with the raised program voltage.

18. The method of claim 15, further comprising, if the counted number of fail bits is the correctable number of fail bits or less, completing the program operation for the data stored in the second latch, moving the data of the next program stored in the first latch to the second latch, and performing a program operation for the next program.

19. The method of claim 14, further comprising determining whether the program verification operation is a single bit or a multi bit verification operation, and if the program verification operation is the single bit verification operation and in response to a detection of at least one fail bit, raising a program voltage, and re-performing the program operation with the raised program voltage.

20. The method of claim 15, further comprising determining whether the program operation is a least significant bit (LSB) page program operation or a most significant bit (MSB) page program operation, and if the program operation is the LSB page program operation and if the counted number of fail bits is within the correctable number of fail bits, performing the MSB page program operation instead.

* * * * *